(12) United States Patent
Yu et al.

(10) Patent No.: US 11,269,439 B2
(45) Date of Patent: Mar. 8, 2022

(54) TOUCH PANEL AND FABRICATION METHOD THEREOF AND TOUCH DISPLAY DEVICE

(71) Applicants: BOE Technology Group Co., Ltd., Beijing (CN); HEFEI BOE OPTOELECTRONICS TECHNOLOGY CO., LTD., Anhui (CN)

(72) Inventors: Shirong Yu, Beijing (CN); Qingyong Meng, Beijing (CN); Chunhui Wu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 858 days.

(21) Appl. No.: 16/071,952

(22) PCT Filed: Sep. 6, 2017

(86) PCT No.: PCT/CN2017/100730
§ 371 (c)(1),
(2) Date: Jul. 23, 2018

(87) PCT Pub. No.: WO2019/015035
PCT Pub. Date: Jan. 24, 2019

(65) Prior Publication Data
US 2021/0173539 A1    Jun. 10, 2021

(30) Foreign Application Priority Data
Jul. 21, 2017  (CN) .......................... 201710600532.2

(51) Int. Cl.
*G06F 3/041* (2006.01)
*G03F 7/004* (2006.01)

(52) U.S. Cl.
CPC ........ *G06F 3/04144* (2019.05); *G06F 3/0412* (2013.01); *G03F 7/0045* (2013.01);
(Continued)

(58) Field of Classification Search
CPC .............. G06F 3/04144; G06F 3/0412; G06F 2203/04105; G06F 2203/04103; G03F 7/0045
See application file for complete search history.

(56) References Cited

U.S. PATENT DOCUMENTS

2010/0225608 A1\* 9/2010 Zhou ................... H01L 27/1259
345/173
2011/0081520 A1 4/2011 Nojiri et al.
(Continued)

FOREIGN PATENT DOCUMENTS

CN   101960413 A   1/2011
CN   102707470 A   10/2012
(Continued)

OTHER PUBLICATIONS

Office Action dated Dec. 2, 2019, issued in counterpart CN application No. 201710600532.2, with English translation. (29 pages).
(Continued)

*Primary Examiner* — Towfiq Elahi
(74) *Attorney, Agent, or Firm* — Westerman, Hattori, Daniels & Adrian, LLP

(57) ABSTRACT

A touch panel comprises a first substrate (1), a second substrate (2) opposite to the first substrate (1), and spacers (5) between the first substrate (1) and the second substrate
(Continued)

(2). At least one of the spacers (5) comprises a piezoelectric material. The piezoelectric material is a graphene-polyborosiloxane composite.

18 Claims, 6 Drawing Sheets

(52) U.S. Cl.
CPC .............. *G06F 2203/04103* (2013.01); *G06F 2203/04105* (2013.01)

(56) References Cited

U.S. PATENT DOCUMENTS

| | | | | |
|---|---|---|---|---|
| 2014/0063365 | A1* | 3/2014 | Li | G06F 3/0412 349/12 |
| 2014/0142242 | A1* | 5/2014 | Gerbec | C08G 79/08 524/588 |
| 2015/0287904 | A1 | 10/2015 | White et al. | |
| 2016/0187985 | A1 | 6/2016 | Lim et al. | |

FOREIGN PATENT DOCUMENTS

| | | |
|---|---|---|
| CN | 202523033 U | 11/2012 |
| CN | 102854668 A | 1/2013 |
| CN | 103092380 A | 5/2013 |
| CN | 104704644 A | 6/2015 |
| CN | 104793821 A | 7/2015 |
| CN | 105607777 A | 5/2016 |
| CN | 105742480 A | 7/2016 |
| CN | 105929577 A | 9/2016 |
| CN | 106597759 A | 4/2017 |
| KR | 100920468 B1 | 10/2009 |
| KR | 20120082631 A | 7/2012 |

OTHER PUBLICATIONS

Extended (Supplementary) European Search Report dated Sep. 20, 2019, issued in counterpart application No. 17895504.3. (7 pages).
Office Action dated May 12, 2020, issued in counterpart CN application No. 201710600532.2, with English translation. (23 pages).
International Search Report dated Apr. 18, 2018, issued in counterpart International Application No. PCT/CN2017/100730 (10 pages).
Boland. Conor S. et al., "Sensitive electromechanical sensors using viscoelastic graphene-polymer nanocomposites". Science, Dec. 9, 2016, vol. 354, Issue 6317, pp. 1257-1260.

* cited by examiner

TOUCH PANEL AND FABRICATION METHOD THEREOF AND TOUCH DISPLAY DEVICE

CROSS-REFERENCE TO RELATED APPLICATIONS

This application claims the benefit of the filing date of Chinese Patent Application No. 201710600532.2 filed on Jul. 21, 2017, the disclosure of which is hereby incorporated by reference.

TECHNICAL FIELD

The present invention relates to a display technology and, more particularly, to a touch panel, a method of fabricating the same, and a touch display device.

BACKGROUND

The present touch technology can be divided into two kinds: One is to attach a display panel to a touch cover to achieve a touch function. The other is to integrate the touch function into the display panel. The latter integrated touch technology is further divided into an on-cell scheme and an in-cell scheme. The on-cell scheme is to form a touch circuit on a surface of a display panel to achieve the touch function. The in-cell scheme is to form a touch circuit between the display panels, for example, between an array substrate and a color film substrate, thereby further reducing a thickness of the display panel. However, the present touch technology can only achieve touch function at a two dimensional (2D) plane. The present touch technology can only calculate X and Y coordinates of a user's finger contacting the display panel, but cannot detect pressing stress of the user's finger. The latest three dimensional (3D) touch technology is to use additional deformation sensors to detect deformation of a protection glass by a user to realize operations with different pressures.

BRIEF SUMMARY

Accordingly, one example of the present disclosure is a touch panel. The touch panel may comprise a first substrate, a second substrate opposite the first substrate, and spacers between the first substrate and the second substrate. At least one of the spacers may comprise a piezoelectric material and the piezoelectric material may be a graphene-polyborosiloxane composite.

The touch panel may further comprise first signal lines on a surface of the first substrate facing the second substrate and second signal lines on a surface of the second substrate facing the first substrate. The first signal lines may be electrically connected to first ends of the spacers respectively, and the second signal lines may be electrically connected to second ends of the spacers respectively. The spacers may be configured to generate detection signals at the second ends of the spacers when the first ends of the spacers are inputted with a reference voltage and the spacers are subjected to a touch pressure.

In one embodiment, at least two of the first ends of the spacers may be electrically connected to a same first signal line, and each of the second signal lines may correspond to one of the spacers respectively.

The touch panel may further comprise first electrodes at regions on the surface of the first substrate facing the second substrate and corresponding to the spacers, and second electrodes at regions on the surface of the second substrate facing the first substrate and corresponding to the spacers. The first signal lines may be electrically connected to the first ends of the spacers through the first electrodes respectively and the second signal lines may be electrically connected to the second ends of the spacers through the second electrodes respectively.

The graphene-polyborosiloxane composite may comprise a polyborosiloxane having a carboxyl group, a light curing group, or an epoxy group at terminals. The graphene-polyborosiloxane composite may comprise a polyborosiloxane having a structure below:

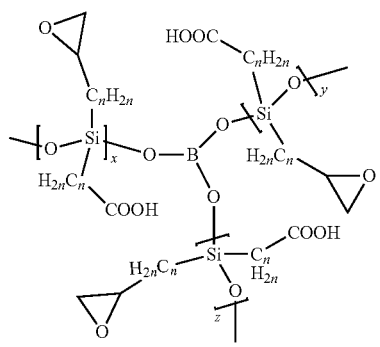

wherein n≤4, 100≤x≤600, 100≤y≤600, and 100≤z≤600.

A mass percentage of graphene nanosheets in the graphene-polyborosiloxane composite may be substantially 10% to 40%. In one embodiment, a mass percentage of graphene nanosheets in the graphene-polyborosiloxane composite may be substantially 25%.

The touch panel may be a touch display panel comprising a plurality of pixel units, and one of the spacers may be located in each of the pixel units.

Another example of the present disclosure is a touch display device. The touch display device may comprise a touch panel according to one embodiment of the present disclosure.

The touch display device may further comprise a detection chip, the detection chip comprising a position detection circuit and a pressure inquiry circuit. The position detection circuit may be configured to detect whether or not detection signals exist in the second signal lines, and determine touch positions based on the detection signals, and the pressure inquiry circuit may be configured to inquire values of touch pressures corresponding to the detection signals from a preset correspondence table.

Another example of the present disclosure is a method of fabricating a touch panel. The method of fabricating a touch panel may comprise forming first signal lines and second signal lines on a first substrate and a second substrate respectively, forming a pattern of spacers on a base substrate by a patterning process, wherein the base substrate is one of the first substrate or the second substrate, and assembling the first substrate and the second substrate to form a cell. At least one of the spacers may comprise a piezoelectric material. The first signal lines may be electrically connected to first ends of the spacers, the second signal lines may be electrically connected to second ends of the spacers, and the spacers may be configured to generate detection signals at the second ends of the spacers when the first ends of the spacers are inputted with a reference voltage and the spacers are subjected to a touch pressure. The piezoelectric material may be a graphene-polyborosiloxane composite. A mass percentage of graphene nanosheets in the graphene-polyborosiloxane composite may be substantially 10% to 40%. In one embodiment, a mass percentage of graphene nanosheets in the graphene-polyborosiloxane composite may be substantially 25%.

In one embodiment, forming the pattern of the spacers may comprise coating a photoresist comprising a graphene-polyborosiloxane composite on the base substrate, exposing the photoresist, and developing the photoresist. The photoresist at regions corresponding to the pattern of the spacers to be formed may be retained. A mass percentage of the graphene-polyborosiloxane composite in the photoresist may be substantially 15% to 25%.

In another embodiment, forming the pattern of the spacers may comprise spraying an ink comprising a graphene-polyborosiloxane composite on the base substrate in areas of the spacers to be formed by an inkjet printing technique, and drying and setting the ink to obtain the pattern of the spacers. A mass percentage of the graphene-polyborosiloxane composite in the ink may be substantially 30% to 50%.

The method of fabricating a touch panel may further comprise, before forming the first signal lines and the second signal lines, forming first electrodes on regions of the first substrate corresponding to the spacers, and/or forming second electrodes on regions of the second substrate corresponding to the spacers. The first electrodes and the second electrodes may be electrically connected to the first signal lines and the second signal lines respectively, and after assembling into a cell, the first electrodes and the second electrodes may be electrically connected to the first ends and the second ends of the spacers respectively.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
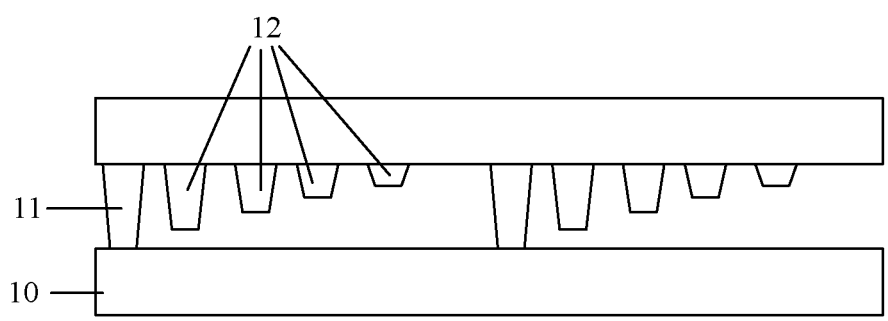
FIG. 1 is a schematic cross-sectional view of a touch panel in the prior art.

The present invention will be described in further detail with reference to the accompanying drawings and embodiments in order to provide a better understanding of the technical solutions of the present invention by those skilled in the art. Throughout the description of the invention, reference is made to FIGS. 1-6. When referring to the figures, like structures and elements shown throughout are indicated with like reference numerals.

FIG. 1 is a schematic structural view of a touch panel in the prior art. As shown in FIG. 1, in order to detect a touch pressure on a touch area of the touch panel, a main spacer 11 and a plurality of auxiliary spacers having different heights 12 are provided in the touch area. When the touch area is subjected to the touch pressure, a corresponding number of auxiliary spacers 12 are moved to contact the opposing substrate 10. Thus, it is possible to determine the level of the touch pressure by detecting the number of the auxiliary spacers 12 contacting the substrate 10.

In the touch panel which can detect a level of a touch pressure, the number of levels of the touch pressure is determined by the number of main and auxiliary spacers. That is, the higher the number of levels of the touch pressure detected, the more the number of auxiliary spacers required. However, as the number of required spacers increases, the structure of the touch panel becomes more complex, and an aperture ratio of pixels in the display panel is also affected.

Figure 2:
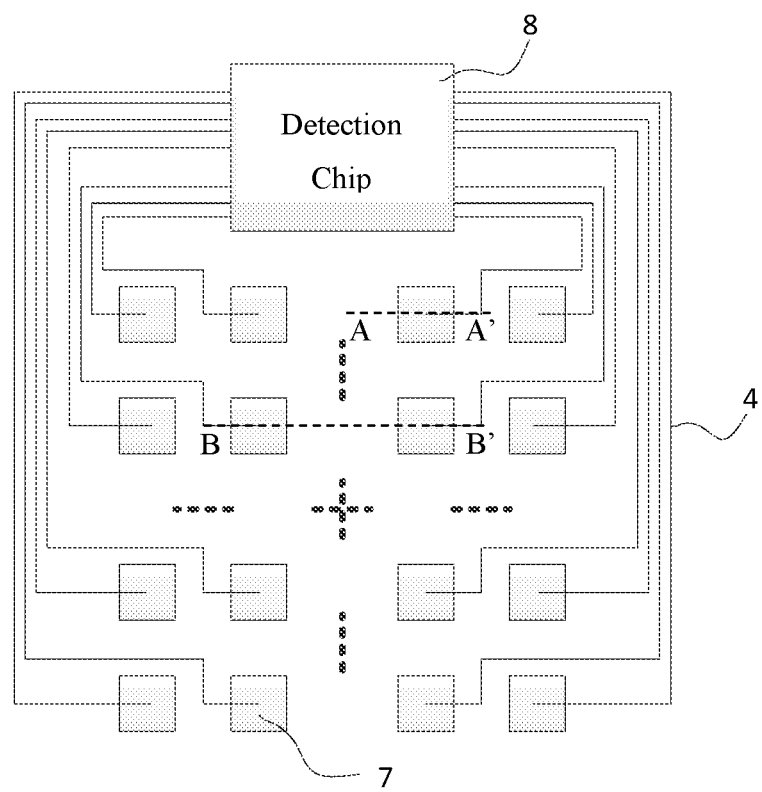
FIG. 2 is a top view of a touch panel according to one embodiment of the present disclosure.
Figure 3:
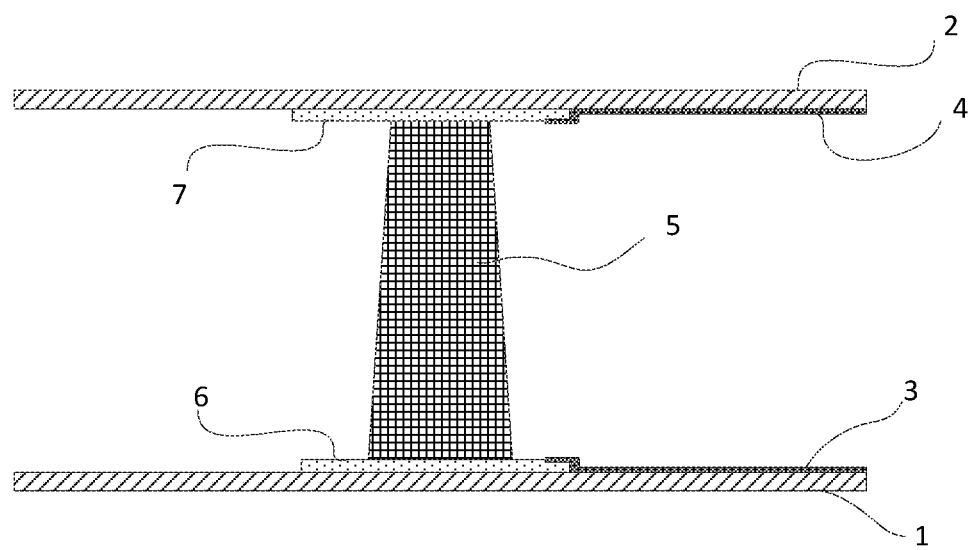
FIG. 3 is a schematic cross-sectional view along a line A-A' in FIG. 2 according to one embodiment of the present disclosure.
Figure 4:
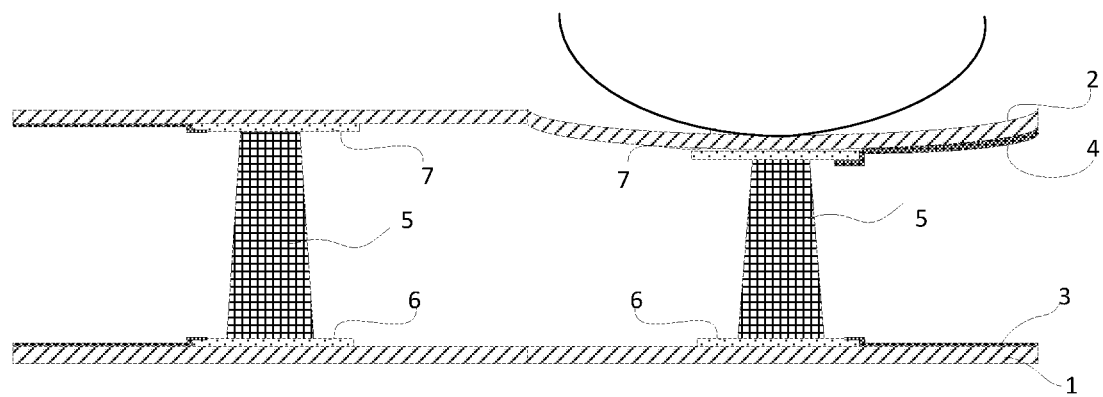
FIG. 4 is a schematic cross-sectional view along a line B-B' in FIG. 2 when touched according to one embodiment of the present disclosure.

FIG. 2 is a top view of a touch panel according to one embodiment of the present disclosure. FIG. 3 is a schematic cross-sectional view along a line A-A' in FIG. 2. FIG. 4 is a schematic cross-sectional view along a line B-B' in FIG. 2 when touched. As shown in FIGS. 2-4, the touch panel includes a first substrate 1, a second substrate 2 opposite the first substrate 1, and an array of spacers 5 between the first substrate 1 and the second substrate 2. The spacers 5 comprise a piezoelectric material.

In one embodiment, first signal lines 3 are formed on a surface of the first substrate 1 facing the second substrate 2. Second signal lines 4 are formed on a surface of the second substrate 2 facing the first substrate 1. The first signal lines 3 are electrically connected to the first ends of the spacers 5, and the second signal lines 4 are electrically connected to the second ends of the spacers 5. It is to be noted that the "first end" in the present invention specifically refers to the end of the spacer facing the first substrate 1, and the "second end" specifically refers to the end of the spacer facing the second substrate 2.

In one embodiment, the first signal lines 3 are connected to a reference voltage input terminal. The first signal lines 3 are used for inputting a reference voltage supplied from the reference voltage input terminal to the first ends of the spacers 5. The second ends of the spacers 5 generate detection signals when the first ends of the spacer 5 are inputted with a reference voltage and the spacers 5 are subjected to a touch pressure. The second signal lines 4 are used for transmitting the detection signals to a detection chip 8, so that the detection chip 8 can determine touch position and touch pressure based on the detection signals.

In one embodiment, the first signal lines 3 are grounded and the reference voltage is the ground voltage. As such, it is not necessary to provide a power source for outputting the reference voltage in the touch panel, thereby reducing production cost. Furthermore, to reduce the number of first signal lines 3, at least two or some of the first ends of the spacers 5 are connected to a same first signal line 3. In another embodiment, all the first ends of the spacers 5 are connected to a same first signal line 3. As such, only one first signal line 3 is needed.

To enhance touch resolution of the touch panel, a spacer 5 can be electrically connected to a second signal line 4 respectively. That is, a spacer 5 and a second signal line 4 correspond to each other. As such, the touch resolution can be maximized in a case where the number of spacers 5 is constant.

In the present embodiment, when the touch panel is touched, the spacers 5 at the touch position are deformed under the pressure. Since materials of the spacers 5 include a piezoelectric material, the spacers 5 generate corresponding detection signals when the deformation occurs, and the detection signals are outputted to the detection chip 8 through the second signal lines 4. Therefore, the detection chip 8 can determine whether or not the spacers 5 electrically connected to the second signal lines 4 are at a touch position based on whether or not the detection signals exist in the second signal lines 4.

In one embodiment, the raw material for the spacer in the touch panel can be obtained by mixing a piezoelectric material into material of a conventional spacer.

In the case of selecting a piezoelectric material in the present embodiment, it is necessary to take into account not only pressure-sensitive level, but also material forming performance thereof, so as to ensure the supporting function of the spacer 5. In one embodiment, the piezoelectric material is a graphene-polyborosiloxane composite. The polyborosiloxane may have a structural formula as shown below:

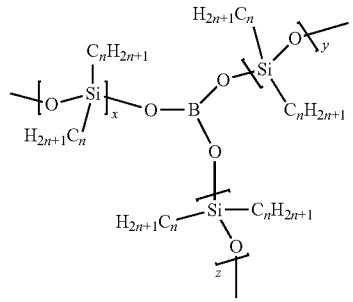

A molar ratio of boron to silicon in the polyborosiloxane may be from 20% to 60%. Alkyl chain $C_nH_{2n-1}$ (n≤4), and each alkyl chain may be different. The high molecular weight polyborosiloxane can be formed by polycondensation of a polysiloxane of a low molecular weight (200 to 1000 g/mol) and having a hydroxyl group at its terminal with boric acid. The alkyl chains $C_nH_{2n-1}$ of the polysiloxane can have a carboxyl group, a light curing group, an epoxy group, and/or other functional groups at their ends based on the required process requirements. 100≤x≤600, 100≤y≤600, and 100≤z≤600. The carboxyl group can provide developing function in a weak alkaline environment. The epoxy group can be thermally cured under action of a curing agent.

In one embodiment, a structural formula of the polyborosiloxane is shown below:

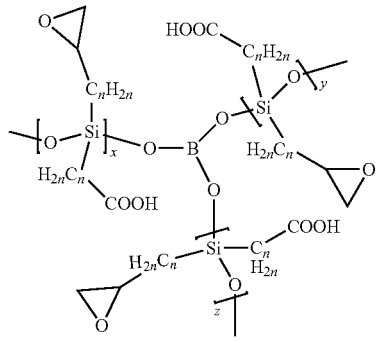

Polysiloxanes having different functional groups at terminals may have the following structural formulae:

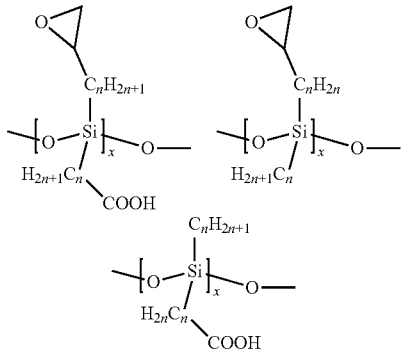

In one embodiment, the graphene-polyborosiloxane composite can be obtained by the following process: graphene nanosheets having a size of 200 nm~800 nm are dispersed in a low molecular weight polysiloxane. A certain amount of polysiloxanes having an epoxy group or a carboxyl group at terminals may be added in accordance with proportions required for the epoxy group and the carboxyl group. Then, boric acid is added, and the mixture is heated to a reaction temperature of 160 to 190° C., preferably a reaction temperature of 180° C., with stirring. As such, a high molecular weight polyborosiloxane composite doped with graphene nanosheets is formed by the polycondensation reaction.

In one embodiment, a mass percentage of graphene nanosheets in a graphene-polyborosiloxane composite is substantially 10% to 40%. "Substantially" herein means that a value can vary by 10% thereof. The relationship between the mass percentage of the graphene nanosheets in the graphene-polyborosiloxane composites and the pressure-sensitive grades (pressure sensitivity) and the material forming properties is shown in Table 1 below.

TABLE 1 relationship of pressure-sensitive grade and spacer forming effect of the graphene-polyborosiloxane composites in accordance with different percentages of graphene nanosheets.

| Mass percentage of graphene nanosheets in a graphene-polyborosiloxane composite (wt %) | Pressure-sensitive grade (mg) | Spacer forming effect |
| --- | --- | --- |
| 5% | >1000 | Excellent |
| 10% | 500~1000 | Excellent |
| 15% | 100~500 | Excellent |
| 20% | 50~100 | Excellent |
| 25% | 20~50 | Excellent |
| 30% | 20~30 | good |
| 35% | 50~100 | good |
| 40% | 500~1000 | good |
| >40% | >1000 | average |

As shown in Table 1, when a mass percentage of graphene nanosheets in a graphene-polyborosiloxane composite is substantially 15%~25%, pressure sensitivity and forming effect of the graphene-polyborosiloxane composite are excellent. A high content of the graphene nanosheets in the composite can enhance electrical properties of the composite. However, at the same time, the high content of the graphene nanosheets can reduce the forming effect of the composite and ultimately affect supporting ability of a spacer made from the composite, and further affect the pressure-sensitive properties of the spacer. Preferably, a mass percentage of graphene nanosheets in a graphene-polyborosiloxane composite is substantially 25%.

It should be known to one of ordinary skill in the art that a mass percentage of graphene nanosheets in a graphene-polyborosiloxane composite can be adjusted based on actual needs during practical application.

In the present embodiment, the above-mentioned piezoelectric material is a graphene-polyborosiloxane composite, and the graphene-polyborosiloxane composite has not only preferable pressure sensitivity, but also excellent forming effect.

Furthermore, since the detection signals generated by the spacers 5 when subjected to different pressures are different, the detection chip 8 can determine corresponding touch pressure levels based on the received detection signals. It should be noted that the detection signal in the present invention may be either a current signal or a voltage signal, and is not limited thereto.

As discussed above, the touch panel according to one embodiment of the present disclosure can detect both touch position and corresponding touch pressure. Compared with the prior art technique for detecting touch pressure at a position by using a plurality of spacers 5, the technical solution of the present disclosure can detect the corresponding touch pressure at a position by using only one spacer 5, thereby reducing the number of spacers 5 in the touch panel and simplifying structure of the touch panel.

In the practical application, it is found that if the signal lines are directly connected to ends of the spacers 5, when the spacers 5 are pressed, the signal lines are subjected to joint action of touch pressure and an elastic force generated due to deformation of the spacers 5. As such, the positions where the signal lines are connected to the spacers 5 are liable to be broken, thereby resulting in failure.

To overcome the above problem, in one embodiment, first electrodes 6 are provided at regions on a side of the first substrate 1 facing the second substrate 2 and corresponding to the spacers 5. The first signal lines 3 are connected to the first electrodes 6, and the first electrodes 6 are connected to the corresponding spacers 5. Second electrodes 7 are provided at regions on a side of the second substrate 2 facing the first substrate 1 and corresponding to the spacers 5. The second signal lines 4 are connected to the second electrodes 7, and the second electrodes 7 are connected to the corresponding spacers 5. In the present embodiment, the first electrodes 6 are provided on the first substrate 1, and the second electrodes 7 are provided on the second substrate 2. The first signal lines 3 are electrically connected to the spacers 5 through the first electrodes 6, and the second signal lines 4 are electrically connected to the spacers 5 through the second electrodes 7. As such, by separating the signal lines from the spacers 5, it is possible to avoid the problem that the signal lines are broken when the spacers 5 are pressed.

The touch panel can be combined with a display panel by means of an In-Cell, On-Cell, or suspension to form a touch display panel. In one embodiment, the touch panel is in-cell with the display panel in which one of the first substrate 1 and the second substrate 2 is an array substrate and the other is an opposite substrate, and accordingly a thickness of the formed touch display panel is relatively small.

It should be noted that the display panel may be a liquid crystal display (LCD) panel or an organic light-emitting diode (OLED) panel.

In one embodiment, the formed touch display panel includes a plurality of pixel units. A spacer 5 may be provided in each of the pixel units. As such, the touch display panel can have a touch resolution, which is the same as the display resolution, thereby resulting in a finer touch experience. This can provide a 3D touch function to achieve full-scene touch operation without limitation of touch objects. The 3D touch function can be applied to art creation, surgery, and other high-precision applications. Of course, the number and the distribution of spacers 5 can be adjusted based on actual needs, and are not illustrated in detail herein.

Another example of the present disclosure provides a touch display device. The touch display device includes a touch display panel provided according to one embodiment of the present disclosure. The details can be found in the description of the above-described embodiment, and will not be repeated here.

In one embodiment, as shown in FIG. 2, the touch display device further includes a detection chip 8. The detection chip 8 includes a position detection circuit and a pressure inquiry circuit. The position detection circuit is used to detect whether or not detection signals exist in the second signal lines 4, and when it is determined that there are detection signals in the second signal lines 4, determine the position corresponding to the spacers 5 connecting to the second signal lines 4 in which the detection signals exist as the touch position. The pressure inquiry circuit is used to inquire a value or level of the touch pressure corresponding to a detection signal from a preset correspondence table. The correspondence table is stored in advance with different detection signals and their corresponding touch pressure values. It should be noted that the correspondence table can be prepared by experimentation in advance.

Another example of the present disclosure provides a method of fabricating a touch display panel in the above-described embodiment.

Figure 5:
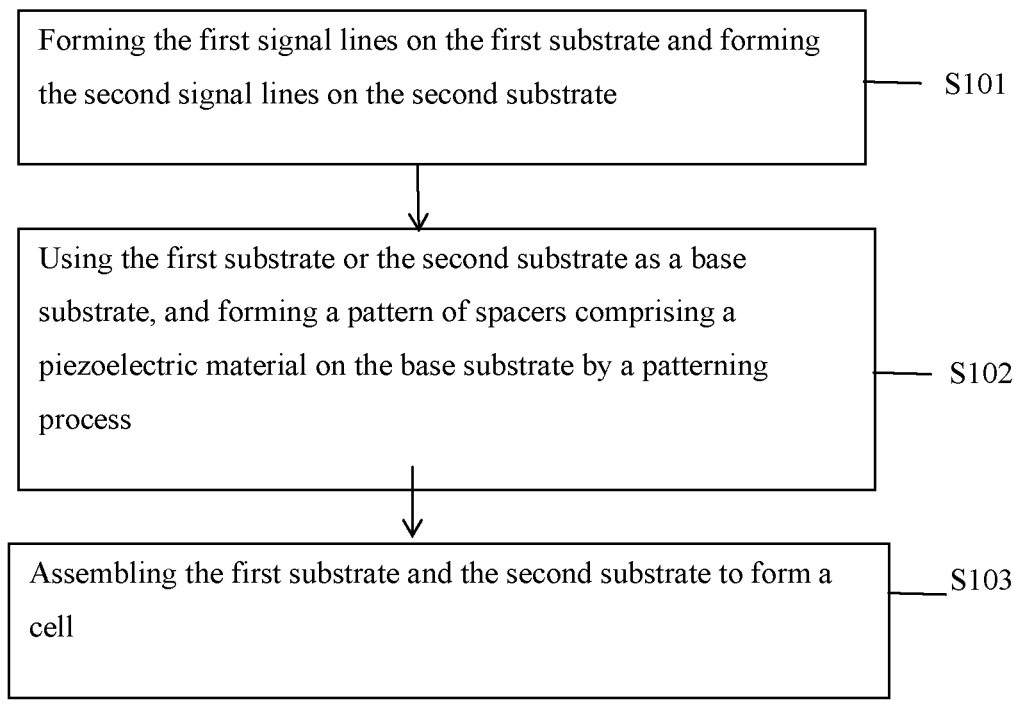
FIG. 5 is a flowchart of a method of fabricating a touch panel according to one embodiment of the present disclosure.

FIG. 5 is a flow chart of a method of fabricating a touch panel according to one embodiment of the present disclosure. As shown in FIG. 5, the fabricating method comprises the following:

During step S101, first signal lines are formed on the first substrate, and second signal lines are formed on the second substrate.

During step S102, a first substrate or a second substrate is used as a base substrate, and a pattern of spacers comprising a piezoelectric material is formed on the base substrate by a patterning process.

In one embodiment, in step S102, the piezoelectric material is a graphene-polyborosiloxane composite. A mass percentage of graphene nanosheets in the graphene-polyborosiloxane composite is from substantially 10% to 40%. In one embodiment, a mass percentage of graphene nanosheets in the graphene-polyborosiloxane composite is substantially 25%. As such, the graphene-polyborosiloxane composite has high pressure sensitivity and excellent forming performance.

In one embodiment, step S102 further comprises steps a step of S1021*a*, a step of 1022*a*, and a step of 1023*a*.

During step S1021*a*, a photoresist comprising a graphene-polyborosiloxane composite is coated on the base substrate.

The photoresist used in step S1021*a* is a mixture of a conventional photoresist for a spacer and a graphene-polyborosiloxane composite. Specifically, monomers of the graphene-polyborosiloxane composite, which include a low molecular weight polysiloxane having alkyl side chains containing functional groups such as a carboxyl group, a photocurable group and/or an epoxy group at their ends, boric acid, 200 nm to 800 nm size of graphene nanosheets, and low molecular weight prepolymers thereof are added into photoresist raw materials comprising monomers of an epoxy resin, an acrylic resin, a phenolic resin and/or the like and low molecular weight prepolymers thereof, a heat curing agent, a photocurable agent, and/or other additives, with stirring. As such, the photoresist used in step S1021a is obtained.

In one embodiment, a mass percentage of total solvent in the photoresist is substantially 70% to 80%, and a mass percentage of the graphene-polyborosiloxane composite in the photoresist is substantially 15% to 25%.

In this embodiment, the mass percentage of the graphene-polyborosiloxane composite in the photoresist corresponds to a certain pressure-sensitive grade and material forming property of the photoresist, as shown in Table 2 below.

TABLE 2 relationship of spacer forming effect, pressure-sensitive grade and touch effect of photoresists with different percentages of a graphene-polyborosiloxane composite.

| Mass percentage of graphene-polyborosiloxane composite in a photoresist (wt %) | Spacer forming effect | Pressure-sensitive grade (mg) | Touch effect |
|---|---|---|---|
| 10% | Excellent | >1000 | Average touch performance |
| 15% | Excellent | 100~500 | Excellent touch performance |
| 20% | Excellent | 20~50 | Excellent touch performance, pixel level of resolution |
| 25% | good | 20~50 | Excellent touch performance, pixel level of resolution |
| 30% | average | 100~500 | Excellent touch performance |
| >30% | average | >1000 | Average touch performance |

As can be seen from Table 2 above, when the mass percentage of the graphene-polyborosiloxane composite in the photoresist is substantially 15% to 25%, the pressure sensitivity and the forming effect of the photoresist are very good. In one embodiment, the mass percentage of graphene-polyborosiloxane composite in a photoresist is substantially 20%.

It should be known by those of ordinary skill in the art that the mass percentage of the graphene-polyborosiloxane composite in the photoresist can be adjusted accordingly based on actual needs in practical application.

In step S1022a, the photoresist is exposed, and the areas on the photoresist corresponding to the spacers to be formed are reserved regions, and the other regions on the photoresist are non-reserved regions.

In step S1023a, the photoresist is subjected to development processing, and the portions of the photoresist corresponding to the non-reserved regions are completely removed, and the portions of the photoresist corresponding to the reserved regions are completely retained to obtain a pattern of the spacer.

In the above steps S1021a to step S1023a, a spacer containing a graphene-polyborosiloxane composite can be prepared by the photomask process.

In another embodiment, step S102 includes a step of S1021b and a step of S1022b.

During step S1021b, an ink including a graphene-polyborosiloxane composite is sprayed in areas of the spacers to be formed by an inkjet printing technique. The ink used in step S1021b is a mixture of the conventional ink for the spacers and a graphene-polyborosiloxane composite. In one embodiment, a mass percentage of total solvent in the ink obtained in step S1021b is substantially 40% to 60%, and a mass percentage of the graphene-polyborosiloxane composite in the ink is substantially 30% to 45%.

In this embodiment, the mass percentage of the graphene-polyborosiloxane composite in the ink corresponds to a certain pressure-sensitive grade of the ink and spacer forming effect of the ink, as shown in Table 3 below.

Table 3, relationship of spacer forming effect, pressure sensitive grade, and touch effect of inks with different percentages of a graphene-polyborosiloxane composite.

| Mass percentage of graphene-polyborosiloxane composite in an ink (wt %) | Spacer forming effect | Pressure-sensitive grade (mg) | Touch effect |
|---|---|---|---|
| 25% | Excellent | >1000 | Average touch performance |
| 30% | Excellent | 100~500 | Excellent touch performance |
| 35% | Excellent | 20~50 | Excellent touch performance, pixel level of resolution |
| 40% | good | 20~50 | Excellent touch performance, pixel level of resolution |
| 45% | average | 100~500 | Excellent touch performance |
| 50% | average | >1000 | Average touch performance |

As can be seen from Table 3 above, when the mass percentage of the graphene-polyborosiloxane composite in the ink is substantially 30% to 45%, the pressure sensitivity and the forming effect of the ink are very good. In one embodiment, the mass percentage of graphene-polyborosiloxane composite in an ink is substantially 35% to 40%.

It should be known to those of ordinary skill in the art that the mass percentage of the graphene-polyborosiloxane composite in the ink can be adjusted accordingly based on actual needs in practical application.

In step S1022b, the ink is subjected to a drying and setting process to obtain a pattern of the spacer.

In the above steps S1021b to S1022b, a spacer containing a graphene-polyborosiloxane composite can be prepared by the inkjet printing technique.

In step S103, the first substrate and the second substrate are assembled to form a cell.

After the box paring process, both ends of the spacer are electrically connected to the first signal lines and the second signal lines, respectively.

During touch recognition, a reference voltage signal is inputted to the first signal lines. The second signal lines are used to output detection signals generated by the spacers due to a pressure to a detection chip, so that the detection chip can determine both touch position and touch pressure based on the detection signals.

The touch panel prepared by the steps S101 to S103 described above detects not only the touch position but also the touch pressure.

Figure 6:
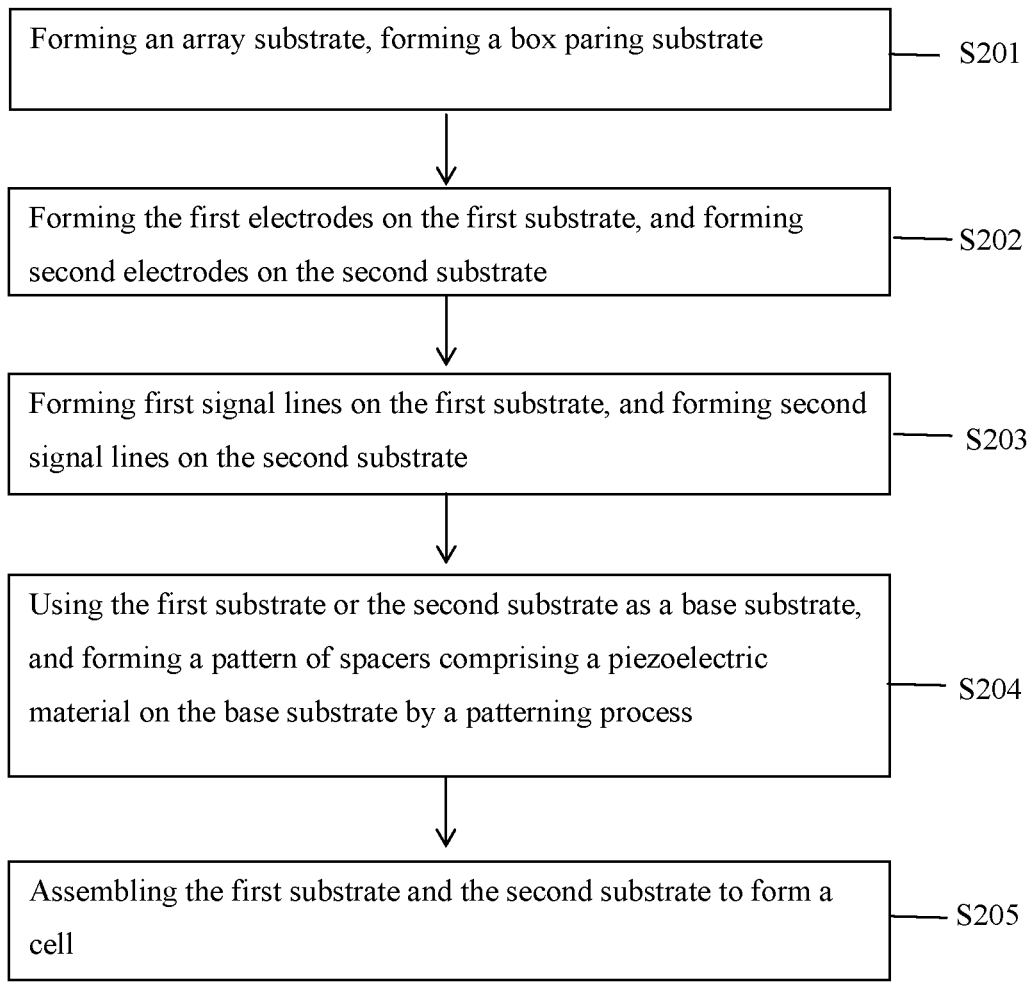
FIG. 6 is a flowchart of a method of fabricating a touch panel according to one embodiment of the present disclosure.

FIG. 6 is a flowchart of a method of fabricating a touch panel according to one embodiment of the present disclosure. As shown in FIG. 6, the touch panel is a touch display panel. The fabricating method includes:

During step S201, an array substrate is formed. An opposite substrate is formed. In step S201, an array substrate and an opposite substrate are prepared by a conventional array substrate fabricating process and a conventional opposite substrate fabricating process, respectively.

After the array substrate and the opposite substrate are formed, an insulating layer is formed on surfaces of the array substrate and the opposite substrate, respectively, to obtain the first substrate (the array substrate and the insulating layer) and the second substrate (the box paring substrate and the insulating layer) respectively.

In step S202, first electrodes are formed on regions of the first substrate corresponding to the spacers, and second electrodes are formed on regions of the second substrate corresponding to the spacers.

Specifically, a thin film of conductive material is formed on the first substrate, and then the thin film of the conductive material film is patterned by a patterning process to obtain a pattern of the first electrodes. In one embodiment, the conductive material is indium tin oxide (ITO).

It should be noted that the "patterning process" in the present disclosure refers to a process including photoresist coating, exposure, development, film etching, photoresist peeling, and the like. Of course, it is also possible to form a pattern of a corresponding structure by a printing process.

The process of forming the second electrodes is similar to the process of forming the first electrodes, and will not be described here.

In step S203, first signal lines are formed on the first substrate, and second signal lines are formed on the second substrate.

First signal lines and second signal lines can be formed on the first substrate and the second substrate, respectively, by a patterning process. The first signal lines are connected to the corresponding first electrodes, and the second signal lines are connected to the corresponding second electrodes.

In one embodiment, when the first electrodes are the same as the first signal lines, a patterning process can be used to simultaneously fabricate the first electrodes and the first signal lines. When the second electrodes are the same as the second signal lines, a patterning process can be used to simultaneously fabricate the second electrodes and the second signal lines.

In step S204, using a first substrate or a second substrate as a base substrate, a pattern of spacers including a piezoelectric material is formed on the base substrate by a patterning process. Description of step S204 is similar to the description of step S102 in the above-described embodiment, and the description thereof is not repeated here.

In step S205, the first substrate and the second substrate are assembled to form a cell.

When the array substrate and the opposite substrate prepared in step S205 are two substrates in a liquid crystal display panel, the assembling process in step S205 may specifically include: alignment film coating, sealing tape coating, liquid crystal infusion, and other processes.

When the array substrate and the opposite substrate prepared in step S205 are two substrates in an organic light emitting diode panel, the assembling process in step S205 may specifically include: two substrate alignment, fixing, and other processes.

After the assembling process of the first substrate and the second substrate is completed, both ends of the spacers are respectively connected to the first electrodes and the second electrodes.

During touch recognition, a reference voltage signal is inputted to the first signal lines. The second signal lines are used to output detection signals generated by the spacers due to a pressure to a detection chip, so that the detection chip can determine both touch position and touch pressure based on the detection signals.

The touch panel prepared by the steps S201 to S205 described above detects not only the touch position but also the touch pressure.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A touch panel, comprising:
a first substrate,
a second substrate opposite the first substrate, and
spacers between the first substrate and the second substrate,
wherein at least one of the spacers comprises a piezoelectric material and the piezoelectric material is a graphene-polyborosiloxane composite; and
the graphene-polyborosiloxane composite comprises a polyborosiloxane having a carboxyl group, a light curing group, or an epoxy group at terminals.

2. The touch panel of claim 1, further comprising:
first signal lines on a surface of the first substrate facing the second substrate,
second signal lines on a surface of the second substrate facing the first substrate,
wherein the first signal lines are electrically connected to first ends of the spacers respectively, and the second signal lines are electrically connected to second ends of the spacers respectively, and
the spacers are configured to generate detection signals at the second ends of the spacers when the first ends of the spacers are inputted with a reference voltage and the spacers are subjected to a touch pressure.

3. The touch panel of claim 2, wherein at least two of the first ends of the spacers are electrically connected to a same first signal line, and
each of the second signal lines corresponds to one of the spacers respectively.

4. The touch panel of claim 2, further comprising:
first electrodes at regions on the surface of the first substrate facing the second substrate and corresponding to the spacers, and
second electrodes at regions on the surface of the second substrate facing the first substrate and corresponding to the spacers,
wherein the first signal lines are electrically connected to the first ends of the spacers through the first electrodes respectively and the second signal lines are electrically connected to the second ends of the spacers through the second electrodes respectively.

5. The touch panel of claim 1, wherein the graphene-polyborosiloxane composite comprises a polyborosiloxane having a structure below:

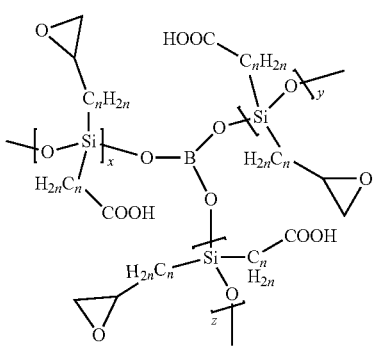

wherein n≤4, 100≤x≤600, 100≤y≤600, and 100≤z≤600.

6. The touch panel of claim 1, wherein a mass percentage of graphene nanosheets in the graphene-polyborosiloxane composite is substantially 10% to 40%.

7. The touch panel of claim 1, wherein a mass percentage of graphene nanosheets in the graphene-polyborosiloxane composite is substantially 25%.

8. The touch panel of claim 1, wherein the touch panel is a touch display panel comprising a plurality of pixel units, and one of the spacers is located in each of the pixel units.

9. A touch display device, comprising the touch panel according to claim 1.

10. The touch display device of claim 9, further comprising
a detection chip, the detection chip comprising a position detection circuit and a pressure inquiry circuit,
wherein the position detection circuit is configured to detect whether or not detection signals exist in the second signal lines, and determine touch positions based on the detection signals, and
the pressure inquiry circuit is configured to inquire values of touch pressures corresponding to the detection signals from a preset correspondence table.

11. A method of fabricating a touch panel, comprising:
forming first signal lines and second signal lines on a first substrate and a second substrate respectively,
forming a pattern of spacers on a base substrate by a patterning process, wherein the base substrate is one of the first substrate or the second substrate, and
assembling the first substrate and the second substrate to form a cell,
wherein at least one of the spacers comprises a piezoelectric material;
the piezoelectric material is a graphene-polyborosiloxane composite; and
the graphene-polyborosiloxane composite comprises a polyborosiloxane having a carboxyl group, a light curing group, or an epoxy group at terminals.

12. The method of fabricating a touch panel of claim 11, wherein the first signal lines are electrically connected to first ends of the spacers, the second signal lines are electrically connected to second ends of the spacers, and the spacers are configured to generate detection signals at the second ends of the spacers when the first ends of the spacers are inputted with a reference voltage and the spacers are subjected to a touch pressure.

13. The method of fabricating a touch panel of claim 11, wherein a mass percentage of graphene nanosheets in the graphene-polyborosiloxane composite is substantially 10% to 40%.

14. The method of fabricating a touch panel of claim 11, wherein forming the pattern of the spacers comprising:
coating a photoresist comprising a graphene-polyborosiloxane composite on the base substrate,
exposing the photoresist, and
developing the photoresist,
wherein the photoresist at regions corresponding to the pattern of the spacers to be formed are retained.

15. The method of fabricating a touch panel of claim 14, wherein a mass percentage of the graphene-polyborosiloxane composite in the photoresist is substantially 15% to 25%.

16. The method of fabricating a touch panel of claim 11, wherein forming the pattern of the spacers comprises:
spraying an ink comprising a graphene-polyborosiloxane composite on the base substrate in areas of the spacers to be formed by an inkjet printing technique, and
drying and setting the ink to obtain the pattern of the spacers.

17. The method of fabricating a touch panel of claim 16, wherein a mass percentage of the graphene-polyborosiloxane composite in the ink is substantially 30% to 50%.

18. The method of fabricating a touch panel of claim 11, further comprising, before forming the first signal lines and the second signal lines,
forming first electrodes on regions of the first substrate corresponding to the spacers, and/or
forming second electrodes on regions of the second substrate corresponding to the spacers,
wherein the first electrodes and the second electrodes are electrically connected to the first signal lines and the second signal lines respectively, and after assembling into a cell, the first electrodes and the second electrodes are electrically connected to the first ends and the second ends of the spacers respectively.

* * * * *